United States Patent [19]
Kniveton et al.

[11] Patent Number: 5,939,996
[45] Date of Patent: Aug. 17, 1999

[54] DISPLAY SIGN AND AN OPTICAL ELEMENT FOR USE IN THE SAME

[75] Inventors: Patrick E Kniveton, Sunderland; John H Brown, Bury St Edmunds, both of United Kingdom

[73] Assignee: Rolls-Royce Power Engineering plc, Newcastle upon Tyne, United Kingdom

[21] Appl. No.: 08/810,815

[22] Filed: Mar. 6, 1997

[30] Foreign Application Priority Data

Mar. 29, 1996 [GB] United Kingdom ............... 9606695

[51] Int. Cl.⁶ ................................................. G08B 5/00
[52] U.S. Cl. .............................. 340/815.4; 340/815.41; 340/815.47; 340/815.76; 362/800
[58] Field of Search .................. 340/815.4, 815.41, 340/815.45, 815.42, 815.47, 815.49, 815.55, 815.73; 362/800; 345/82, 44, 46

[56] References Cited

U.S. PATENT DOCUMENTS

| | | | |
|---|---|---|---|
| 1,626,406 | 4/1927 | Godley | 340/815.76 |
| 1,806,051 | 5/1931 | Fisher et al. | 340/815.76 |
| 2,068,805 | 1/1937 | Lebby | 340/815.76 |
| 2,334,418 | 11/1943 | Land | 340/815.41 |
| 2,576,849 | 11/1951 | Moore | 340/815.41 |
| 2,907,249 | 10/1959 | Hjermstad | 340/815.41 |
| 3,119,894 | 1/1964 | Nagel et al. | 340/815.76 |
| 4,035,681 | 7/1977 | Savage, Jr. | 362/800 |
| 4,298,869 | 11/1981 | Okuno | 362/800 |
| 4,965,488 | 10/1990 | Hihi | 362/800 |
| 5,013,144 | 5/1991 | Silverglate et al. | 362/800 |
| 5,173,810 | 12/1992 | Yamakawa | 359/819 |
| 5,388,035 | 2/1995 | Bodem, Jr. | 362/800 |
| 5,528,474 | 6/1996 | Roney et al. | 362/800 |

FOREIGN PATENT DOCUMENTS

| | | |
|---|---|---|
| 61-185980 | 8/1986 | Japan . |
| 61-214485 | 9/1986 | Japan . |
| 6-186911 | 7/1994 | Japan . |
| 2 282 700 | 4/1995 | United Kingdom . |
| 2 295 274 | 5/1996 | United Kingdom . |

OTHER PUBLICATIONS

"Lights, Lighting Circuits, Horns" from "Motor Services Automotive Encyclopedia" p. 427, Jan. 1969.
Patent Abstracts of Japan, Section E–480, p. 109 & JP61–214485, Mar. 1985.

*Primary Examiner*—Donnie L. Crosland
*Attorney, Agent, or Firm*—W. Warren Taltavull; Farkas & Manelli PLLC

[57] ABSTRACT

An optical element is fitted to a high intensity light emitting diode used in a variable message sign. The optical element has surfaces which redirect any stray light from the light emitting diode to form useful light. The faces of the optical element are angled to shape the light beam emitted therefrom. The light beam is shaped by the faces to produce a beam having increased intensity in a predetermined direction. The optical element enhances the visibility of the sign and allows a reduction in the number of light emitting diodes used in the sign.

26 Claims, 3 Drawing Sheets

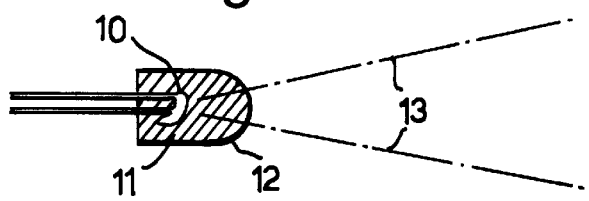
Fig.1.
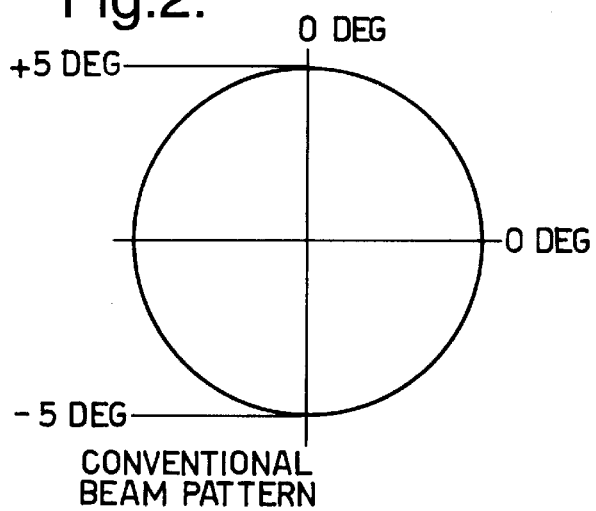
Fig.2. CONVENTIONAL BEAM PATTERN
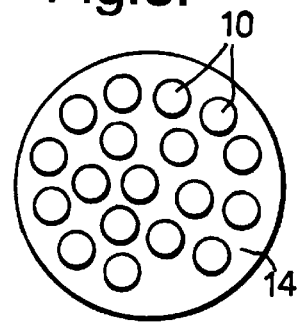
Fig.3.
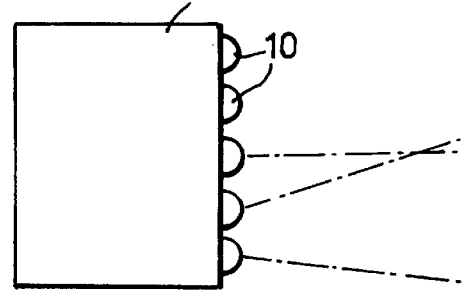
Fig.4.
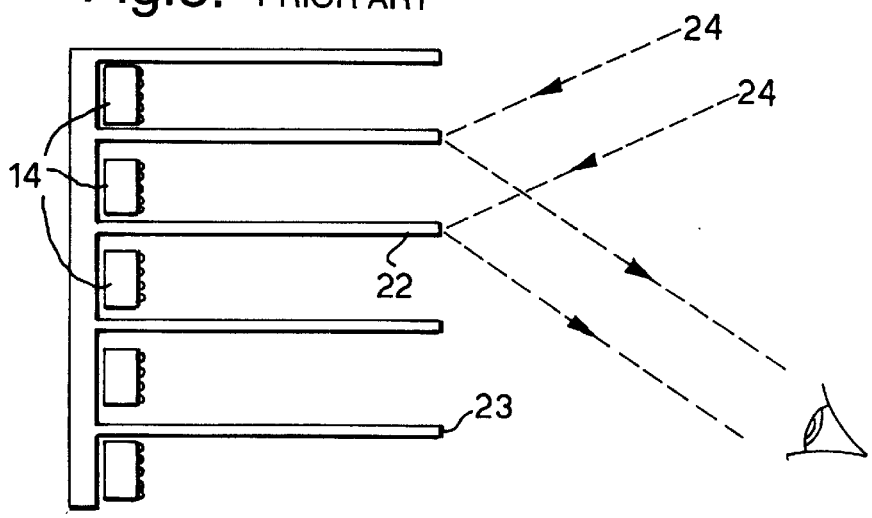
Fig.5. PRIOR ART

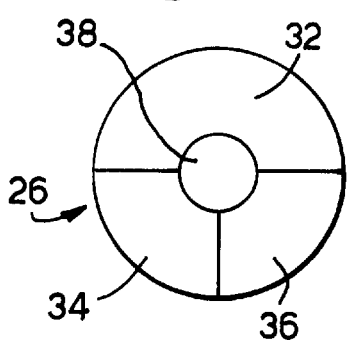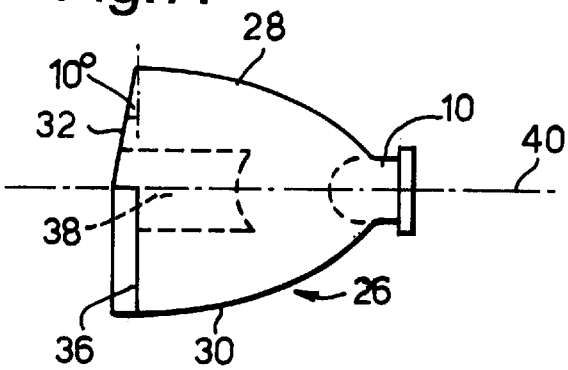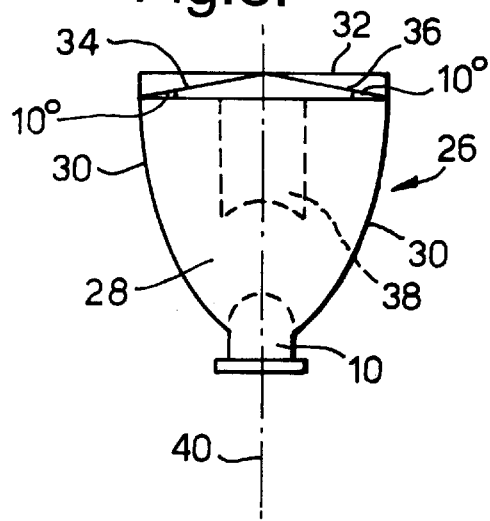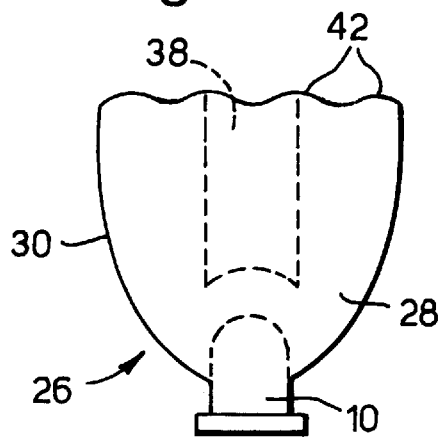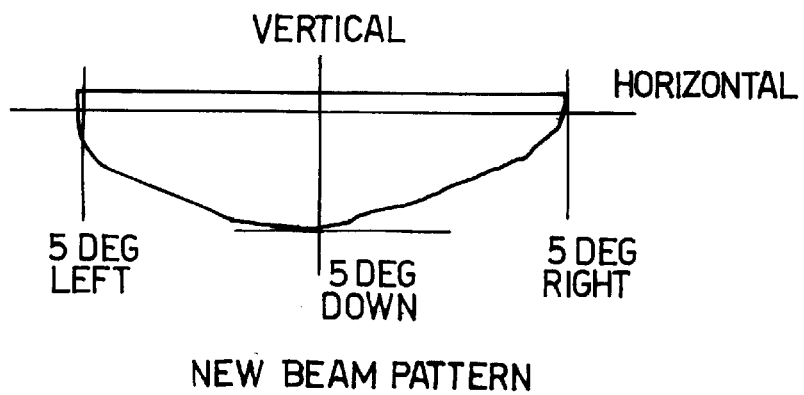

DISPLAY SIGN AND AN OPTICAL ELEMENT FOR USE IN THE SAME

THE FIELD OF THE INVENTION

The present invention relates to a display sign and in particular to improved optical elements used in display signs.

BACKGROUND OF THE INVENTION

Electronic variable message signs are used in transport applications to give route information to motorists. The signs have electro-optical characters which are selectively illuminated to display a message to passing motorists.

The optical performance of the electro-optical characters have to meet the stringent requirements of the Highways Agency. To meet these requirements existing signs use clusters of light emitting diodes which are driven hard to achieve acceptable brightness. Each cluster of light emitting diodes is shielded to give good visibility in the brightest ambient conditions.

Conventional light emitting diodes are encapsulated within a cylindrical clear resin capsule which has a domed end. Light rays from the light emitting diode are collected and directed by the domed end into a cone of light which is either symmetrical or asymmetrical around the principal axis of the cylinder. More than 80% of the generated light is lost by being emitted and subsequently scattered outside the primary viewing cone.

British patent application number GB 2,282,700-A describes an optical element which is used in conjunction with conventional light emitting diodes to redirect the light scattered outside the primary viewing cone. The optical element thereby increases the amount of useful light emitted by each of the light emitting diodes.

SUMMARY OF THE INVENTION

The present invention seeks to further improve the optical element described in GB 2,282,700-A so that the light output from each light emitting diode is greater in the direction required for transport applications. The use of the improved optical elements enhances the visibility of the sign. Enhancing the visibility enables a reduction in the number of light emitting diodes required for the sign to be visible in daylight and reduces the power consumption of the sign. The design of the shields has also been improved and the shields are formed as an integral part of a display module used in the sign which results in a more compact design.

According to the present invention a display sign comprises a plurality of electro-optical devices each electro-optical device being provided with an optical element having surfaces at which any stray light emitted from the electro-optical device is reflected and a plurality of angled faces from which a light beam is emitted, the faces are angled to shape the light beam emitted therefrom and increase the beam intensity in a predetermined direction. The visibility of a message displayed on the sign is thus enhanced.

The faces from which the light beam is emitted is preferably inclined by an angle of 10° to a plane normal to a principal axis of the optical element. In the preferred embodiment of the present invention the faces from which the light is emitted form an annular face which may be formed from three angled faces.

In a further embodiment of the present invention the face from which the light is emitted is ribbed. The ribs may have a cross-sectional shape which is semi-circular or elliptical. The ribs provide a higher proportion of light across the horizontal plane.

In the preferred embodiment of the present invention the individual electro-optical elements are light emitting diodes. The individual light emitting diodes may be shielded. Preferably the leading edge of the shields are angled to deflect any light incident thereon in a downwards direction. The shields may be formed integrally with a display module in the sign.

Location means may be provided to align the optical element relative to the sign.

A further aspect of the present invention is an optical element for use with an light emitting diode. The optical element may be adhesively bonded to the light emitting diode. Alternatively the optical element may be formed integrally therewith.

BRIEF DESCRIPTION OF THE DRAWINGS

The present invention will now be described with reference and as shown in the accompanying drawings in which:

FIG. 1 shows a basic light emitting diode.

FIG. 2 illustrates the shape of the beam emitted by a light emitting diode shown in FIG. 1.

FIGS. 3 & 4 show a conventional light emitting diode cluster used to provide sufficient light in a variable message sign.

FIG. 5 shows a display module of a conventional variable message sign incorporating conventional light emitting diode clusters and shields.

FIG. 6 is a front elevational view of an optical element in accordance with the present invention.

FIGS. 7 and 8 show different side views of an optical element in accordance with the present invention fitted to a conventional light emitting diode.

FIG. 9 illustrates the shape of the beam typically emitted by a light emitting diode fitted with an optical element shown in FIGS. 6, 7 and 8.

FIG. 10 shows an optical element in accordance with a second embodiment of the present invention.

DETAILED DESCRIPTION OF THE INVENTION

Figure 11:
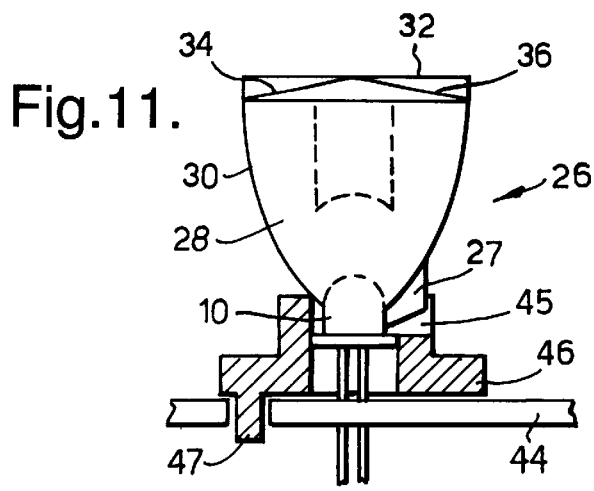
FIG. 11 is a part cross-sectional view of a mounting arrangement for accurately locating an optical element in accordance with the present invention in a display sign.

Referring to FIG. 1 a basic light emitting diode 10 is encapsulated within a cylindrical clear resin capsule 11. Light is emitted from the domed end 12 of the capsule 11 in a cone 13. Most of the light emitted by the light emitting diode 10 is scattered outside the cone 13.

FIG. 2 illustrates the shape of the beam emitted by the conventional light emitting diode shown in FIG. 1.

FIG. 3 shows a cluster 14 of light emitting diodes 10 used in a conventional variable message sign. The light emitting diodes 10 in the cluster 14 are arranged to emit light at different angles, shown by the dotted lines in FIG. 4, to give the desired beam of light. Uniformity in the beam of light emitted from the cluster 14 is however difficult to achieve.

In a display module used in a conventional variable message sign, FIG. 5, large numbers of light emitting diode clusters 14 have been needed to generate enough light for the sign to be visible in daylight. Since the majority of light is lost by scatter the light emitting diodes 10 are driven hard and much power is required. The light emitting diode clusters 14 are mounted on a backplate 20 and are provided with shields 22. The shields 22 are fabricated from sheet plastic or metal and protect the light emitting diode clusters 14 from bright sunlight. The shields 22 have flat leading edges 23 which cause sun rays 24 to be reflected to the sign viewer. Reflection of the sunlight off these edges reduces the contrast of the sign when viewed in bright sunlight.

In a variable message sign in accordance with the present invention optical elements 26, shown in FIGS. 6–8 are mounted on the pre-encapsulated light emitting diodes 10. The optical element 26 is transparent and has a body part 28 made from a plastic material such as polymethylmethacrylate. The body part 28 is optically bonded to the light emitting diode 10 using a water clear adhesive such as Loctite 350 which is hardened by the application of ultraviolet light rays. Although the optical element 26 is bonded to the light emitting diode 10 it will be appreciated by one skilled in the art that it could be formed as an integral part of a pre-encapsulated light emitting diode 10.

The optical element 26 has surfaces 30 which redirect stray light from the light emitting diode 10 by total internal reflection so that it is emitted as useful light. The surfaces 30 may be silvered to further improve the reflectivity of the surface. The surface 30 of the optical element 26 ensures that a higher proportion of the luminous flux from each light emitting diode 10 is projected into the required emitted beam.

The cross section of a beam of light emitted from the optical element 26 is shaped as shown in FIG. 9 by the angled faces 32, 34 and 36 at the front of the optical element 26. The upper face 32 deflects the light downwards, the left side face 34 deflects the beam rightward and the right side face 36 produces a leftward beam. A central aperture 38 is spherical or elliptical and provides a light beam close to the principal axis 40.

The angles of the surfaces 32, 34 and 36 are determined by Snell's law. Snell's law is denoted by the equation;

$$u1/u2 = \sin i / \sin r,$$

where u1 is the refractive index of air, u2 is the refractive index of the transparent material of the optical deflecting device, i and r are the angles of the light rays normal to the surface interface in air and the transparent material respectively.

In the preferred embodiment of the present invention the faces 32, 34 and 36 are angled by approximately 10° to a plane normal to the principal axis 40. The principal axis 40 is the central axis in the direction of the light emitted from the optical element 26. The angled faces 32, 34 and 36 produce a beam pattern as shown in FIG. 9 which has increased intensity in the downwards direction.

The beam pattern shown in FIG. 9 is suitable for signs used in transport applications on high speed straight roads. However in the case of roads in urban areas there is a need to provide a larger horizontal viewing angle to ensure that the sign can be read from junctions and across bends by a passing motorist. For urban transport applications the beam pattern is modified by adding ribs 42 to the front face of the optical element 26 as shown in FIG. 10. The ribs 42 create a uniform zone across the horizontal plane. The cross sectional shape of the ribs 42 is semicircular or elliptical to provide the required proportion of light rays across the horizontal plane.

It will be appreciated by one skilled in the art that for other transport applications the front face of the optical element 26 could be provided with a combination of angled faces 32, 34 & 36 and ribs 42.

The individual light emitting diodes 10 fitted with the optical elements 26 are mounted on a single printed circuit board 44. A flanged mounting plate 46, FIG. 11, is used to accurately fix the position and orientation of the optical element 26 relative to the printed circuit board 44. The optical element 26 is provided with a fin 27 which locates in a slot 45 in the flanged mounting plate 46. The flanged mounting plate 46 is then located on the printed circuit board 44 by a pin 47. The flanged mounting plate 46 can be a separate or an integral part of the optical element 26.

Figure 12:
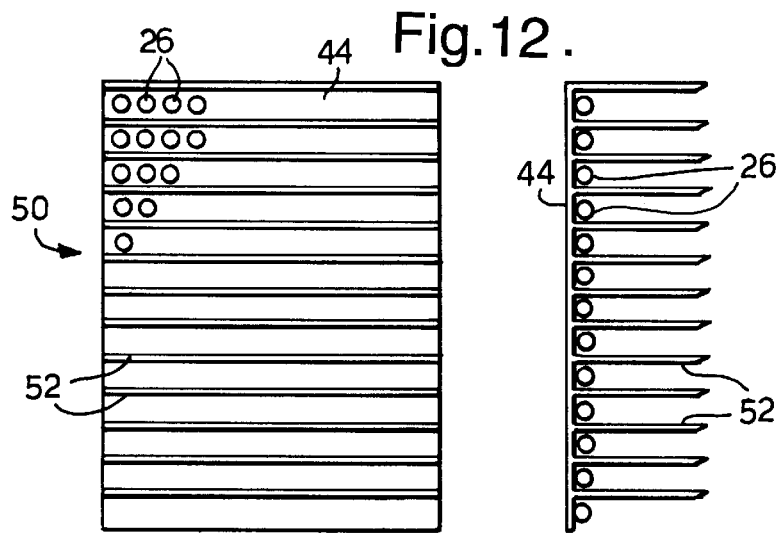
FIG. 12 shows of set of light emitting diodes in accordance with the present invention mounted with shields in a display module used in a sign in accordance with the present invention.
Figure 13:
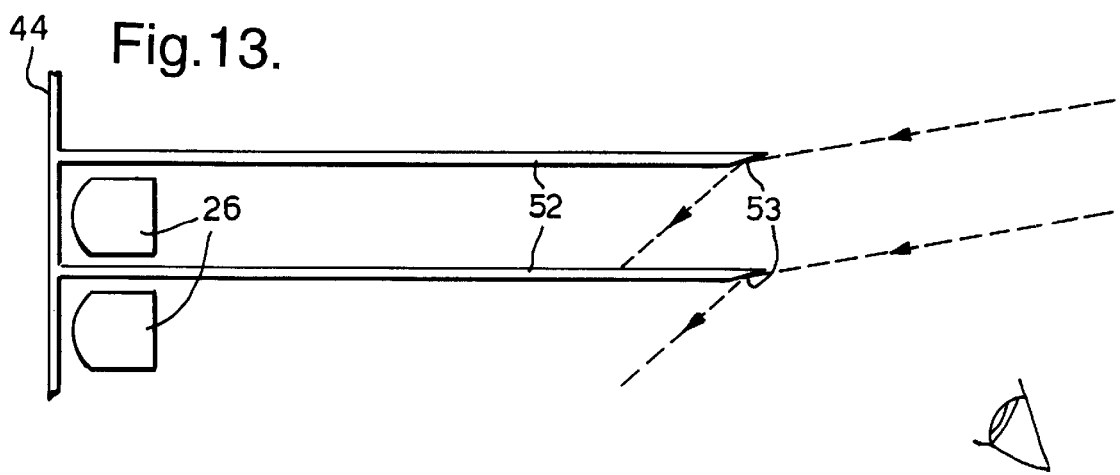
FIG. 13 shows the effect of the shields on ambient sunlight.

The printed circuit board 44 fitted with the light emitting diodes 10 and optical elements 26 forms part of a display module 50 shown in FIG. 12. Each row of diodes 10 in the module 50 are provided with shields 52 which further enhance the visibility of the sign in the brightest ambient conditions. The length of the shields 52 is reduced because of the smaller size of the optical device and the way the light emitted from the top of the optical element 26 is directed downwards. The shields 52 can thus be fitted much closer to the diodes 10 and the leading edges 53 of the shields 52 is angled to deflect the incoming rays of sunlight down instead of back to the viewer, FIG. 13. To further enhance the contrast the surfaces of the shields 22 adjacent the clusters 14 are textured by the provision of ribs which deflect the ambient light away from the clusters 14. In the preferred embodiment of the present invention the shields 52 are moulded from polycarbonate and the ribs are spark eroded into the surfaces of the shields. The shields are formed as an integral part of the sign which is constructed from a combination of composites and plastics to give temperature and UV stability.

A sign incorporating optical elements 26 in accordance with the present invention offers the advantage that the beam pattern matches the requirements for transport applications both in beam intensity and shape. This improves the visibility of the sign characters at long distances and in the brightest ambient conditions. As the light output is much greater in the required directions fewer light emitting diodes 10 are required to achieve the output for the sign to be visible in full daylight. This reduces the power consumption of the sign.

Further design improvements have been made possible by simply mounting all components on a lightweight printed circuit board 44 and making this into a complete module 50 for building into a sign.

We claim:

1. A display sign comprising a plurality of electro-optical devices, each electro-optical device having an optical element mounted thereon, said optical element having a principal axis, the optical element having surfaces at which any stray light emitted from the electro-optical device is reflected and a plurality of faces at least two of which are inclined at an angle of 10° to a plane normal to said principal axis from which a light beam is emitted, each face being angled to direct the light emitted therefrom in a different direction to shape the light beam and increase the beam intensity in a predetermined direction, each said optical element being mounted in contact with each said electro-optical device without any gap between said electro-optical device and said optical element.

2. A display sign as claimed in claim 1 in which the electro-optical devices are light emitting diodes.

3. A display sign as claimed in claim 1 in which the angled faces from which the light beam is emitted are provided with ribs.

4. A display sign as claimed in claim 1 in which the angled faces from which the light beam is emitted form an annular face.

5. A display sign as claimed in claim 4 in which the annular face is formed from three angled faces.

6. A display sign as claimed in claim 1 in which the optical element is formed integrally with the electro-optical device.

7. A display sign as claimed in claims 1 in which the optical element is formed separately from the electro-optical device.

8. A display sign as claimed in claim 7 in which means are provided for accurately locating the optical element in the sign.

9. A display sign as claimed in claim 8 in which the locating means is a projection provided on the optical element which locates in a slot in a flanged mounting plate adjacent the electro-optical device the flanged mounting plate being attached by a further projection to the sign.

10. A display sign as claimed in claim 1 in which the electro-optical devices are protected from ambient light by shields, the angled faces of the optical element direct the light so it does not interfere with the shields.

11. A display sign as claimed in claim 10 in which the leading edges of the shields are angled to deflect incoming ambient light rays downwards.

12. A display sign as claimed in claim 10 or 11 in which the surfaces of the shields are textured to deflect light away from the electro-optical devices.

13. A display sign as claimed in claim 12 in which ribs are spark eroded into the surfaces of the shields.

14. A display sign as claimed in claim 10 in which the shields are formed integrally with the display sign.

15. An optical assembly comprising an electro-optical device provided with an optical element having a principal axis and which reflects any stray light emitted from the electro-optical device, the optical element having a plurality of angled faces from which a light beam is emitted, the faces being angled at 10° to a plane normal to said principal axis to direct the light in different directions to shape the light being emitted therefrom and increase the intensity of the light beam in a predetermined direction, said optical element and said electro-optical device being formed integrally without any air gap between said electro-optical device and said optical element.

16. An optical element for use in a variable message sign comprising a body part having surfaces arranged to reflect light which in operation is incident thereon and direct said light through a plurality of faces, said body part having a principal axis, the faces through which the light is emitted being angled at 10° to a plane normal to said principal axis to direct the light in different directions to shape the light beam emitted therefrom and increase the intensity of the light beam in a predetermined direction, said optical element being mounted directly upon an electro-optical device which emits said light, said optical element being mounted in contact with said electro-optical device without any gap between said electro-optical device and said optical element.

17. An optical element as claimed in claim 16 in which the angled faces from which the light beam is emitted is provided with ribs.

18. An optical element as claimed in claim 16 in which the angled faces from which the light is emitted form an annular face.

19. An optical element as claimed in claim 18 in which the annular face is formed from three angled faces.

20. An optical assembly comprising an electro-optical device provided with an optical element which reflects any stray light emitted from the electro-optical device and which has a principal axis, the optical element having a plurality of angled faces from which a light beam is emitted, the faces being angled at 10° to a plane normal to said principal axis to direct the light indifferent directions to shape the light being emitted therefrom and increase the intensity of the light beam in a predetermined direction, said optical element being mounted directly upon the electro-optical device, said optical element being mounted in contact with said electro-optical device without any gap between said electro-optical device and said optical element.

21. An optical assembly as claimed in claim 20 in which the angled faces from which the light beam is emitted are provided with ribs.

22. An optical assembly as claimed in claim 20 in which the angled faces from which the light is emitted form an annular face.

23. An optical assembly as claimed in claim 22 in which the annular face is formed from three angled faces.

24. An optical assembly as claimed in claim 20 in which the optical element is formed separately from the electro-optical device.

25. An optical assembly as claimed in claim 24 in which means are provided for correctly locating the optical element on the electro-optical device.

26. An optical assembly as claimed in claim 20 in which the electro-optical devices are light emitting diodes.

* * * * *